United States Patent
Jarvis

(10) Patent No.: US 9,663,675 B2
(45) Date of Patent: May 30, 2017

(54) INK FOR LASER IMAGING

(71) Applicant: DataLase Ltd., Widnes (GB)

(72) Inventor: Anthony Jarvis, Widnes (GB)

(73) Assignee: DataLase Ltd. (GB)

(*) Notice: Subject to any disclaimer, the term of this patent is extended or adjusted under 35 U.S.C. 154(b) by 0 days.

(21) Appl. No.: 14/908,790

(22) PCT Filed: Jul. 30, 2014

(86) PCT No.: PCT/GB2014/052333
§ 371 (c)(1),
(2) Date: Jan. 29, 2016

(87) PCT Pub. No.: WO2015/015200
PCT Pub. Date: Feb. 5, 2015

(65) Prior Publication Data
US 2016/0168407 A1    Jun. 16, 2016

(30) Foreign Application Priority Data

Jul. 30, 2013  (GB) .................................. 1313593.4

(51) Int. Cl.
| | | |
|---|---|---|
| *C09D 11/037* | (2014.01) | |
| *C09D 11/50* | (2014.01) | |
| *B41M 5/28* | (2006.01) | |
| *B41M 5/30* | (2006.01) | |
| *B41M 5/323* | (2006.01) | |
| *B41M 5/333* | (2006.01) | |
| *G03G 7/00* | (2006.01) | |
| *G03G 9/12* | (2006.01) | |
| *G03G 9/135* | (2006.01) | |
| *C23C 16/56* | (2006.01) | |

(52) U.S. Cl.
CPC .............. *C09D 11/50* (2013.01); *B41M 5/30* (2013.01); *C09D 11/037* (2013.01); *C23C 16/56* (2013.01); *G03G 7/00* (2013.01); *G03G 9/122* (2013.01); *G03G 9/1355* (2013.01); *B41M 5/282* (2013.01); *B41M 5/323* (2013.01); *B41M 5/333* (2013.01)

(58) Field of Classification Search
CPC ...... C09D 11/037; C09D 11/50; B41M 5/282; B41M 5/30; B41M 5/323; B41M 5/3333
USPC .................. 106/31.14, 31.32, 31.64, 31.9
See application file for complete search history.

(56) References Cited

U.S. PATENT DOCUMENTS

| | | | | |
|---|---|---|---|---|
| 8,048,608 B2* | 11/2011 | Jarvis | ..................... | C09D 11/50 106/400 |
| 8,278,243 B2* | 10/2012 | Khan | ..................... | C09D 11/50 503/201 |
| 8,308,860 B2* | 11/2012 | Jarvis | ..................... | B41M 5/30 106/31.32 |
| 8,398,760 B2* | 3/2013 | Jarvis | ..................... | B41M 5/282 106/31.32 |
| 8,507,178 B2* | 8/2013 | Jarvis | ..................... | B41M 5/267 430/270.1 |
| 8,557,510 B2* | 10/2013 | Walker | ................ | B41M 5/3333 430/332 |
| 8,663,902 B2* | 3/2014 | Jarvis | ..................... | B41M 5/323 430/270.16 |
| 9,321,130 B2* | 4/2016 | Sarver | ..................... | B23K 26/18 |
| 2010/0279079 A1* | 11/2010 | Campbell | ............. | B41M 5/282 428/195.1 |
| 2010/0310787 A1* | 12/2010 | Lehmann | ................ | B29C 65/16 427/517 |
| 2012/0045624 A1* | 2/2012 | Campbell | ........... | B41M 5/3275 428/195.1 |
| 2012/0129090 A1* | 5/2012 | Mamak | ................. | B82Y 30/00 430/108.6 |

FOREIGN PATENT DOCUMENTS

| | | |
|---|---|---|
| EP | 2361783 A1 | 8/2011 |
| GB | 1208731 A | 10/1970 |
| WO | 02068731 A1 | 9/2002 |
| WO | 02074548 A2 | 9/2002 |

(Continued)

OTHER PUBLICATIONS

International Search Report for Application No. PCT/GB2014/052333 dated Oct. 22, 2014.
Lee et al., "Facile fabrication of high-efficiency near-infrared absorption film with tungsten bronze nanoparticle dense layer" (Nanoscale Res Lett. 2014; 9(1): 294).
Mamak et al., "Thermal plasma synthesis of tungsten bronze nanoparticles for near infra-red absorption applications", (J. Mater. Chem., 2010, 20, 9855-9857).
Reis et al., "Synthesis of Novel Compounds with the Pyrochlore and Hexagonal Tungsten Bronze Structures", J. Solid State Chem., vol. 96, Issue 1, pp. 31-47, 1992.

*Primary Examiner* — Helene Klemanski
(74) *Attorney, Agent, or Firm* — Lerner, David, Littenberg, Krumholz & Mentlik, LLP

(57) ABSTRACT

In a first aspect, the invention provides an ink formulation comprising: (a) a near infrared absorbing system comprising a compound of the formula $M^1W_{1.6}O_6$, wherein $M^1$ is one or more elements selected from the group consisting of H, He, alkali metals such as Li, Na, K, Rb, Cs, alkaline earth metals such as Be, Mg, Ca, Sr, Ba, rare-earth elements, Zr, Cr, Mn, Fe, Ru, Co, Rh, Ir, Ni, Pd, Pt, Cu, Ag, Au, Zn, Cd, AL Ga, in, Tl, Si, Ge, Sn, Pb, Sb, B, F, P, S, Se, Br, Te, Ti, Nb, V, Mo, Ta, Re, Hf, Os, Bi and I, or ammonium; (b) a color change agent; and (c) a binder. The invention also provides alternative ink formulations for laser marking, a method of forming an image using the ink formulations and a substrate coated with the ink formulation of the invention. Ink formulations according to the invention have been found to have good laser imaging efficacy, and an essentially negligible impact on the background color of the coating.

36 Claims, No Drawings

(56) References Cited

FOREIGN PATENT DOCUMENTS

| WO | 2005068207 A1 | 7/2005 |
|---|---|---|
| WO | 2006108745 A1 | 10/2006 |
| WO | 2006129078 A1 | 12/2006 |
| WO | 2006129086 A1 | 12/2006 |
| WO | 2007012578 A1 | 2/2007 |
| WO | 2007141522 A1 | 12/2007 |
| WO | 2008107345 A1 | 9/2008 |
| WO | 2009059900 A2 | 5/2009 |
| WO | 2009093028 A2 | 7/2009 |
| WO | 2010001171 A1 | 1/2010 |
| WO | 2010029329 A1 | 3/2010 |
| WO | 2010046285 A2 | 4/2010 |
| WO | 2010049281 A1 | 5/2010 |
| WO | 2011005631 A2 | 1/2011 |
| WO | 2011008944 A2 | 1/2011 |

\* cited by examiner

INK FOR LASER IMAGING

CROSS-REFERENCE TO RELATED APPLICATIONS

The present application is a national phase entry under 35 U.S.C. §371 of International Application No. PCT/GB2014/052333 filed Jul. 30, 2014, which claims the priority of Great Britain Patent Application No. 1313593.4, filed Jul. 30, 2013. The disclosures of said applications are incorporated by reference herein.

FIELD OF THE INVENTION

This invention relates to laser imaging.

BACKGROUND OF THE INVENTION

There are many attractions in using non-contact near-IR sources, in particular diode and fibre lasers, to generate images from coatings for applications such as variable information packaging. Favourable attributes of diode and fibre lasers such as economy, portability and ease of use, are attractive for current needs in the packaging industry, such as in-store labelling.

Virtually all colour change materials used in laser sensitive coatings absorb mid-IR radiation and therefore can be activated using mid-IR lasers such as $CO_2$ lasers that emit radiation at approximately 10.6 microns. However, these same colour change materials usually have negligible absorbance in the near-IR region and consequently they cannot be activated using near-IR lasers that emit in the 700 to 2,500 nm region. Near-IR lasers are often more convenient to use than $CO_2$ lasers particularly in term of retrofitting to production lines due to their more compact size. Also near-IR lasers are more readily made into an individually addressed 'array' type emitting device than $CO_2$ lasers are, which due to the absence of moving galvo mirrors offers the potential to image at fast line speeds.

However, by incorporating, into these same ink formulations, materials which absorb radiation from near-IR sources such as diode and fibre lasers, coatings have been produced which will generate a distinct coloured image on exposure to near, as well as mid or far-IR irradiation.

WO 2005/068207 describes an ink formulation comprising a marking component and a metal salt that absorbs laser irradiation at 700-2000 nm and thereby causes the marking component to change colour. This allows the utilization of diode and $CO_2$ lasers for imaging applications on packaging, for example.

WO 2007/141522 describes an ink formulation comprising a marking component and a metal salt that absorbs laser irradiation at 780-2500 nm and thereby causes the marking component to change colour. A preferred metal salt is reduced indium tin oxide.

EP2361783 describes a thermosensitive recording medium including a support; an image recording layer on the support; and an inorganic material in particle form as a light-heat conversion material, wherein the inorganic material has a ratio of Y to X, represented by Y/X, of 2 or greater, where X denotes an average value of absorption intensities with respect to light having wavelengths in the range of 400 nm to 700 nm, and Y denotes a maximum value among absorption intensities with respect to light having wavelengths greater than 700 nm but smaller than or equal to 1,200 nm. The light-heat conversion material may include particles of at least one of a metal boride and a metal oxide and a tungsten oxide compound is mentioned as an option for the metal oxide. The disclosure focuses on the formation of a thermoreversible recording medium.

It is desirable to provide to provide further ink formulations having good laser imaging efficacy, but which have an essentially negligible impact on the background colour of the coating.

SUMMARY OF THE INVENTION

In a first aspect, the invention provides an ink formulation comprising:
 (a) a near infrared absorbing system comprising a compound of the formula $M^1W_{1.6}O_6$, wherein $M^1$ is one or more elements selected from the group consisting of H, He, alkali metals such as Li, Na, K, Rb, Cs, alkaline earth metals such as Be, Mg, Ca, Sr, Ba, rare-earth elements, Zr, Cr, Mn, Fe, Ru, Co, Rh, Ir, Ni, Pd, Pt, Cu, Ag, Au, Zn, Cd, Al, Ga, In, TI, Si, Ge, Sn, Pb, Sb, B, F, P, S, Se, Br, Te, Ti, Nb, V, Mo, Ta, Re, Hf, Os, Bi and I, or ammonium;
 (b) a colour change agent; and
 (c) a binder.

In a second aspect, the invention provides an ink formulation comprising:
 (a) a near infrared absorbing system comprising compound of the formula $M^1_pW_nO_q$, wherein p, n and q satisfy the relationships p≤n and q≥3n and wherein $M^1$ is one or more elements selected from the group consisting of H, He, alkali metals such as Li, Na, K, Rb, Cs, alkaline earth metals such as Be, Mg, Ca, Sr, Ba, rare-earth elements, Zr, Cr, Mn, Fe, Ru, Co, Rh, Ir, Ni, Pd, Pt, Cu, Ag, Au, Zn, Cd, Al, Ga, In, TI, Si, Ge, Sn, Pb, Sb, B, F, P, S, Se, Br, Te, Ti, Nb, V, Mo, Ta, Re, Hf, Os, Bi and I, or ammonium;
 (b) a colour change agent; and
 (c) a binder;
 wherein the formulation does not comprise both of binary tungsten oxide and tungsten metal.

In a third aspect, the invention also relates to a substrate coated with an ink formulation according to the invention.

In a fourth aspect, the invention provides a method of providing an image on a substrate comprising:
 (a) applying an ink formulation according to the invention to the substrate to form a coating; and
 (b) exposing at least part of the coating to electromagnetic radiation so as to form an image.

In a fifth aspect, the invention provides an ink formulation comprising a tungsten bronze of the formula $M^2_xW_yO_z$, wherein $M^2$ is one or more elements selected from the group consisting of H, He, alkali metals such as Li, Na, K, Rb, Cs, alkaline earth metals such as Be, Mg, Ca, Sr, Ba, rare-earth elements, Zr, Cr, Mn, Fe, Ru, Co, Rh, Ir, Ni, Pd, Pt, Cu, Ag, Au, Zn, Cd, Al, Ga, In, TI, Si, Ge, Sn, Pb, Sb, B, F, P, S, Se, Br, Te, Ti, Nb, V, Mo, Ta, Re, Hf, Os, Bi and I, or ammonium; and wherein x, y and z satisfy the relationships 0.001≤x/y≤2 and 2.2≤z/y≤3, and wherein the said tungsten bronze has an absorptivity ratio of "α to β" of <2.

Preferably, the tungsten bronze has the formula $Cs_{0.33}WO_3$.

The ink formulations according to the invention have been found to have good laser imaging efficacy, and an essentially negligible impact on the background colour of the coating.

DESCRIPTION OF PREFERRED EMBODIMENTS

The Near Infrared Absorbing System

In each aspect of the invention, $M^1$ is preferably an alkali metal selected from Li, Na, K, Rb, and Cs. Most preferably, $M^1$ is Cs.

In a preferred embodiment of the first aspect of the invention the formulation does not comprise both of binary tungsten oxide and tungsten metal and more preferably comprises neither binary tungsten oxide nor tungsten metal.

In a preferred embodiment of the second aspect of the invention, the compound of the formula $M^1_p W_n O_q$ is such that p is 1, n is 1.6 and q is 6. Other materials of the formula $M^1_p W_n O_q$ are pyrochlores of the formula $M^1 W_2 O_6 O_{1/2}$ and compounds with the hexagonal tungsten bronze structure $M^1_p WO_{3+p/2}$, as discussed in "Synthesis of Novel Compounds with the Pyrochlore and Hexagonal Tungsten Bronze Structures", J. Solid State Chem., 96, 31-47, 1992.

In a preferred embodiment, the near infrared absorbing system further comprises a tungsten bronze of the formula $M^2_x W_y O_z$, wherein $M^2$ is one or more elements selected from the group consisting of H, He, alkali metals such as Li, Na, K, Rb, Cs, alkaline earth metals such as Be, Mg, Ca, Sr, Ba, rare-earth elements, Zr, Cr, Mn, Fe, Ru, Co, Rh, Ir, Ni, Pd, Pt, Cu, Ag, Au, Zn, Cd, Al, Ga, In, Tl, Si, Ge, Sn, Pb, Sb, B, F, P, S, Se, Br, Te, Ti, Nb, V, Mo, Ta, Re, Hf, Os, Bi and I, or ammonium; and wherein x, y and z satisfy the relationships $0.001 \leq x/y \leq 1$ and $2.2 \leq z/y \leq 3$.

Tungsten bronzes can be synthesised as described in "Facile fabrication of high-efficiency near-infrared absorption film with tungsten bronze nanoparticle dense layer" (Nanoscale Res Lett. 2014; 9(1): 294), "Thermal plasma synthesis of tungsten bronze nanoparticles for near infra-red absorption applications" (J. Mater. Chem., 2010, 20, 9855-9857), or as discussed in WO 2011005631.

In the tungsten bronze of the formula $M^2_x W_y O_z$, $M^2$ is preferably an alkali metal selected from Li, Na, K, Rb, and Cs. Most preferably, $M^2$ is Cs.

In another preferred embodiment, x, y and z satisfy the relationships $0.2 \leq x/y < 1$ and $z/y = 3$. More preferably, the tungsten bronze has the formula $Cs_{0.28-0.34}WO_3$. One preferred example of a tungsten bronze of the formula $M^2_x W_y O_z$ is $Cs_{0.32}WO_3$.

Preferably, the near infrared absorbing system comprises $CsW_{1.6}O_6$ and $Cs_{0.28-0.34}WO_3$ and most preferably, the near infrared absorbing system comprises $CsW_{1.6}O_6$ and $Cs_{0.32}WO_3$. A powder of this composition can be obtained from Shanghai huzheng nanotechnology Co., Ltd under the name GTO-P100.

In the first aspect of the invention, it is preferred that the compound of the formula $M^1 W_{1.6}O_6$ and the tungsten bronze of the formula $M^2_x W_y O_z$ are present at a ratio of $M^1 W_{1.6}O_6 : M^2_x W_y O_z$ of from 1:100 to 5:1, preferably from 1:50 to 1:1, more preferably from 1:20 to 1:2, most preferably from 1:10 to 1:5. The ratio of the components can be determined by X-ray diffraction.

Similarly, in the second aspect of the invention, it is preferred that the compound of the formula $M^1_p W_n O_q$ and the tungsten bronze of the formula $M^2_x W_y O_z$ are present at a ratio of $M^1_p W_n O_q : M^2_x W_y O_z$ of from 1:100 to 5:1, preferably from 1:50 to 1:1, more preferably from 1:20 to 1:2, most preferably from 1:10 to 1:5. The ratio of the components can be determined by X-ray diffraction.

In another preferred embodiment, the near infrared absorbing system has a ratio of α to β represented by α/β, of less than 2, where β denotes an average value of absorption intensities with respect to light having wavelengths in the range of 400 nm to 700 nm, and α denotes a maximum value among absorption intensities with respect to light having wavelengths greater than 700 nm but smaller than or equal to 1,200 nm. Generally, the ratio of α to β, represented by α/β is less than 1.9 or less than 1.8. Usually, the ratio of α to β, represented by α/β is at least 0.8, at least 1, or at least 1.1. Most preferably, the ratio of α to β, represented by α/β, is in the range 1.0 to 1.5.

β and α of the near infrared absorbing system powder can be readily determined using a suitable spectrophotometer operating in absorbance mode.

The near infrared absorbing system is preferably in the form of a powder. Preferably, the powder has an average particle size in the range 1 nm to 1,000 nm, preferably 1 nm to 500 nm, even more preferably 1 nm to 200 nm, and most preferably 1 nm to 100 nm. The near infrared absorbing system can either have the required particle size when the ink is formulated or the required particle size can be achieved by milling in the ink. The average particle size referred to is the D[4,3] average, which can be measured by laser diffraction for example.

The concentration of the near infrared absorbing system should be enough to render any subsequent coatings imagable, but have essentially negligible impact on the background colour of the coating. Preferably the concentration of the near infrared absorbing system in the ink is 0.05 to 10% w/w, more preferably 0.1 to 2.5% w/w and most preferably 0.25 to 1% w/w. Preferably, the concentration of the near infrared absorbing system is one that imparts to the ink acceptable imageability, but has a background colour difference of ΔE less than or equal to 5.0, measured at a coatweight of 5 gsm on white paper, as compared to the same ink formulation without the presence of a near infrared absorbing system.

Colour Change Agent

The colour change agent can generate colour in response to an energy source. Preferably, the colour change agent is an irreversible colour change agent. However, reversible colour change agents are also within the scope of the present invention.

The term "irreversible" means that the colour, once generated, cannot be deliberately erased and then re-coloured. The colour can change into another colour, but it cannot be made to return to a colourless state or its original colour, and then converted back again to the initial generated colour.

The term "irreversible" does exclude the possibility that colour may fade gradually on exposure to background environmental conditions such as sunlight.

The colour change agent can be an inorganic metal oxyanion compound such as a molybdate, tungstate or chromate, preferably wherein the cation is an alkali metal or an alkaline earth metal or ammonium. One example is sodium molybdate. Particularly preferred are ammonium salts of metal oxyanions. Most preferably, the colour change agent is ammonium octamolybdate. Further suitable examples are taught in WO 02/074548.

The colour change agent can be an organic colour former. Examples include leuco dyes. These can be photochromic, which change colour on exposure to light such as UV light, or halochromic, which change colour on exposure to changes in environmental pH. Halochromic organic colour formers can be used in combination with a colour developer such as a lewis acid compound, or acid generating agent such as a thermal acid generating agent, particularly an irreversible thermal acid generating agent.

Examples of organic halochromic colour formers include those that are based on triphenylmethane, fluorans, phenothiazines, auramines, spiropyrans and indolinophthalides. Particularly preferred are black halochromic colour formers. Examples of suitable leuco dyes are listed below:

2-anilino-3-methyl-6-dibutylaminofluoran,
3,3-bis(p-dimethylaminophenyl)-phthalide,
3,3-bis(p-dimethylaminophenyl)-6-dimethylaminophthalide (otherwise called "crystal violet lactone"),
3,3-bis(p-dimethylaminophenyl)-6-diethylaminophthalide,
3,3-bis(p-dimethylaminophenyl)-6-chlorophthalide,
3,3-bis(p-dibutylaminophenyl)phthalide,
3-cyclohexylamino-6-chlorofluoran,
3-dimethylamino-5,7-dimethylfluoran,
3-diethylamino-7-chlorofluoran,
3-diethylamino-7-methylfluoran,
3-diethylamino-7,8-benzofluoran,
3-diethylamino-6-methyl-7-chlorofluoran,
3-(N-p-tolyl-N-ethylamino)-6-methyl-7-anilinofluoran,
2-[N-(3'-trifluoromethylphenyl)amino]-6-dethylaminofluoran,
2-[3,6-bis(diethylamino)-9-(o-chloroanilino)xanithylbenzoic acid lactam],
3-diethylamino-6-methyl-7-(m-tnchloromethylanilino)fluoran,
3-diethylamino-7-(o-chloroanilino)fluoran,
3-pyrrolidino-6-methyl-7-anilinofluoran,
3-di-n-butylamino-7-o-chloroanilinofluoran,
3-N-methyl-N, n-amylamino-6-methyl-7-anilinofluoran,
3-N-methyl-N-cyclohexylamino-6-methyl-7-anilinofluoran,
3-diethylamino-6-methyl-7-anilinofluoran,
3-(N,N-diethylamino)-5-methyl-7-(N,N-dibenzylamino) fluoran, benzoyl leuco methylene blue,
6'-chloro-8'-methoxy-benzoindolino-spiropyran,
6'-bromo-3'-methoxy-benzoindolino-spiropyran,
3-(2'-hydroxy-4'-dimethylaminophenyl)-3-(2'-methoxy-5'-chlorophenyl)phthalide,
3-(2'-hydroxy-4'-dimethylaminophenyl)-3-(2'-methoxy-5'-nitrophenyl)phthalide,
3-(2'-hydroxy-4'-diethylaminophenyl)-3-(2'-methoxy-5'-methylphenyl)phthalide,
3-(2'-methoxy-4'-dimethylaminophenyl)-3-(2'-hydroxy-4'-chloro-5'-methylphenyl)phthalide,
3-(N-ethyl-N-tetrahydrofurturyl)amino-6-methyl-7-anilinofluoran,
3-N-ethyl-N-(2-ethoxypropyl)amino-6-methyl-7-anilinofluoran,
3-N-methyl-N-isobutyl-6-methyl-7-anilinofluoran,
3-morpholino-7-(N-propyl-trifluoromethylanilino)fluoran,
3-pyrrolidino-7-trifluoromethylanilinofluoran,
3-diethylamino-5-chloro-7-(N-benzyl-trifluoromethylanilino)fluoran,
3-pyrrolidino-7-(di-p-chlorophenyl)methylaminofluoran,
3-diethylamino-5-chloro-7-(a-phenylethylamino)fluoran,
3-(N-ethyl-p-toluidino)-7-(a-phenylethylamino)fluoran,
3-diethylamino-7-(o-methoxycarbonylphenylamino)fluoran,
3-diethylamino-5-methyl-7-(a-phenylethylamino)fluoran,
3-diethylamino-7-pipendinofluoran,
2-chloro-3-(N-methyltoluidino)-7-(p-n-butylanilino)fluoran,
3-di-n-butylamino-6-methyl-7-anilinofluoran,
3,6-bis(dimethylamino)fluorenespiro(9,3')-6'-dimethylaminophthaide,
3-(N-benzyl-N-cyclohexylamino)-5,6-benzo-7-a-naphthylamino-4'-bromofluoran, 3-diethylamino-6-chloro-7-anilinofluoran,
3-diethylamino-6-methyl-7-mesitydino-4', 5'-benzofluoran,
3-N-methyl-N-isopropyl-6-methyl-7-anilinofluoran,
3-N-ethyl-N-isoamyl-6-methyl-7-anilinofluoran,
3-diethylamino-6-methyl-7-(2',4'-dimethylanilino)fluoran,
3-morpholino-7-(N-propyl-trifluoromethylanilino)fluoran,
3-pyrrolidino-7-trifluoromethylanilinofluoran,
3-diethylamino-5-chloro-7-(N-benzyl-trifluoromethylanilino)fluoran,
3-pyrrolidino-7-(di-p-chlorophenyl)methylaminofluoran,
3-diethylamino-5-chloro-([alpha]-phenylethylamino)fluoran,
3-(N-ethyl-p-toluidino)-7-([alpha]-phenylethylamino)fluoran,
3-diethylamino-7-(o-methoxycarbonylphenylamino)fluoran,
3-diethylamino-5-methyl-7-([alpha]-phenylethylamino) fluoran,
3-diethylamino-7-piperidinofluoran,
2-chloro-3-(N-methyltoluidino)-7-(p-N-butylanilino)fluoran,
3,6-bis(dimethylamino)fluorenspiro(9,3')-6'-dimethylaminophthalide,
3-(N-benzyl-N-cyclohexylamino)-5,6-benzo-7-a-naphthylamino-4'-bromofluoran, 3-diethylamino-6-chloro-7-anilinofluoran,
3-N-ethyl-N-(2-ethoxypropyl)amino-6-methyl-7-anilinofluoran,
3-N-ethyl-N-tetrahydrofurfurylamino-6-methyl-7-anilinofluoran,
3-diethylamino-6-methyl-7-mesitydino-4',5'-benzofluoran,
3-(p-dimethylaminophenyl)-3-[1,1-bis(p-dimethylaminophenyl)ethylene-2-yl]phthalide,
3-(p-dimethylaminophenyl)-3-[1,1-bis(p-dimethylaminophenyl)ethylene-2-yl]-6-dimethylaminophthalide,
3-(p-dimethylaminophenyl)-3-(1-p-dimethylaminophenyl-1-phenylethylene-2-yl)phthalide,
3-(p-dimethylaminophenyl)-3-(1-p-dimethylaminophenyl-1-p-chlorophenylethylene-2-yl)-6-dimethylaminophthalide,
3-(4'-dimethylamino-2'-methoxy)-3-(1"-p-dimethylaminophenyl-1"-p-chlorophenyl-1",3"-butadiene-4"-yl)benzophthalide,
3-(4'-dimethylamino-2'-benzyloxy)-3-(1"-p-dimethylaminophenyl-1"-phenyl-1",3"-butadiene-4"-yl)benzophthalide,
3-dimethylamino-6-dimethylamino-fluorene-9-spiro-3'-(6'-dimethylamino)phthalide,
3,3-bis-[2-(p-dimethylaminophenyl)-2-(p-methoxyphenyl) ethenyl]-4,5,6,7-tetrachlorophthalide,
3-bis[, 1-bis(4-pyrrolidinophenyl)ethylene-2-yl]-5,6-dichloro-4,7-dibromophthalide,
bis(p-dimethylaminostyryl)-1-naphthalenesulfonylmethane, and
bis(p-dimethylaminostyryl)-1-p-tolylsulfonylmethane.

These may be used individually or in combination.

Particularly preferred halochromic leuco dyes are: 3'-(N-Ethyl-p-tolylamino)-6'-methyl-7'-anilinofluoran (also known as ETAC, CAS: 59129-79-2), 2-anilino-6-dibutylamino-3-methylfluoran (also known as Pergascript Black 2C, CAS: 89331-94-2), and 2-anilino-3-methyl-6-diethylaminofluoran (also known as Pergascript Black 1C, CAS: 29512-49-0), which are preferably included in a concentration from 2 to 25% w/w.

Examples of thermal acid generating agents include the boron and silicon based complex ammonium salt compounds as taught in WO2006/108745. Preferred examples of these are those based on complexes formed between boron and salicylic acid, and a particularly preferred example of such a compound is the tri-n-butyl ammonium salt version: tri-n-butylammonium borodisalicylate; and the compound N-(p-Toluenesulfonyl) N'-(3-p-toluenesulfonyloxyphenyl) urea (Pergafast 201, ex. BASF). Other examples include "onium" type compounds such as sulphonium and iodonium salts. Further examples of colour developers are taught in WO2010/049281.

The most preferred Lewis acid type colour developers are zinc salts, particularly zinc salts of aliphatic or aromatic carboxylic acids, such as zinc stearate, zinc salicylate, and zinc benzoate and derivatives thereof.

The colour change agent can be a compound that comprises a diacetylene or —C≡C—C≡C— group. Particularly preferred are those diacetylenes that are activatable. That is are made in a form that is initially unreactive to UV light but can be converted into a form reactive to UV light by for example heating and cooling, or melt-recrystalisation. The diacetylene could be reversibly or irreversibly activatable. Suitable examples are taught in WO2009/093028, WO2010/001171, WO2011/08944, WO2010/029329 and also the unpublished application GB1208731.8.

In the final substrate there can be more than one type of colour change agent present, and they can be located within the same layer or in multiple layers.

The colour change agent can also be a charge transfer compound such as a carbazole, which can be used in combination with an acid generating agent.

In another embodiment, the colour change agent is a charrable agent. The charrable agent can be any substance that undergoes a charring reacting on heating to yield a contrasting colour. Suitable examples of charrable agents are compounds that typically contain a high content of carbon and oxygen. Typically, the charrable agent contains at least one hydroxyl group. Preferably the charrable agent is a carbohydrate. Examples of suitable carbohydrates include saccharides, polysaccharides, sugars, polysugars and wherein the carbonyl group has been reduced to a hydroxyl group, to give a sugar alcohol, starches, celluloses, gums and the like.

Examples include but are not limited to glucose, sucrose, saccharose, fructose, dextrose, lactose, sorbitol, xylitol, pectin, mannitol, manitose, erythritol, galactose, cellobiose, mannose, arabinose, ribose, erythrose, xylose, cyclodextrin, meso-erythritol, pentaerythritol, indulin, dextrin, polydextrose, maltose, maltodextrin of any DE, corn syrups, starch, amylose, amylopectin, pectic acid, cellulose and cellulose derivatives such as such as sodium-CMC, and hydroxypropylcellulose, galactomannans, guar gum, locust bean gum, gum arabic and the like. Other examples of charrable agents include amino acids, amino sugars such as glucosamine, chitin and chitosan, alginates as taught in WO06/129086, gluconates and malonates as taught in WO06/129078, any of the charrable chemistries which undergo an elimination reaction as taught in WO02/068205 such as poly(vinyl alcohol) and poly(vinyl chloride). Further examples of charrable agents are taught in WO08/107345.

In a preferred embodiment, the charrable agent is used in combination with an acid or base generating agent such as a metal salt.

Binder

The binder can be any suitable binder. Preferably, the binder is a polymeric binder. Examples of polymeric binders are acrylic polymers, styrene polymers and hydrogenated products thereof, vinyl polymers, polyolefins and hydrogenated or epoxidized products thereof, aldehyde polymers, epoxide polymers, polyamides, polyesters, polyurethanes, sulfone-based polymers and natural polymers and derivatives thereof. The polymeric binder can also be a mixture of polymeric binders.

Acrylic polymers are polymers formed from at least one acrylic monomer or from at least one acrylic monomer and at least one styrene monomer, vinyl monomer, olefin monomer and/or maleic monomer. Examples of acrylic monomers are acrylic acid or salts thereof, acrylamide, acrylonitrile, d-6-alkyl acrylates such as ethyl acrylate, butyl acrylate or hexyl acrylate, di(Ci-4-alkyl-amino)Ci-6-alkyl acrylates such as dimethylaminoethyl acrylate or diethylaminoethyl acrylate and Ci-4-alkyl halide adducts thereof such as dimethylaminoethyl acrylate methyl chloride, amides formed from di(Ci-4-alkylamino)Ci-6-alkylamines and acrylic acid and d-4-alkyl halide adducts thereof, methacrylic acid or salts thereof, methacrylamide, methacrylonitrile, Ci-6-alkyl methacrylates such as methyl methacrylate or ethyl methacrylate, di(Ci-4-alkyl-amino)Ci-6-alkyl methacrylates and Ci-4-alkyl halide adducts thereof, amides formed from di(Ci-4-alkylamino)Ci_6-alkylamines and methacrylic acid and Ci-4-alkyl halide adducts thereof and crosslinker such as [Lambda]/./V-nnethylenebisacrylamide.

Examples of styrene monomers are styrene, 4-methylstyrene and 4-vinylbiphenyl. Examples of vinyl monomers are vinyl alcohol, vinyl chloride, vinylidene chloride, vinyl isobutyl ether and vinyl acetate. Examples of olefin monomers are ethylene, propylene, butadiene and isoprene and chlorinated or fluorinated derivatives thereof such as tetrafluroethylene. Examples of maleic monomers are maleic acid, maleic anhydride and maleimide.

Examples of acrylic polymers are poly(methyl methacrylate), poly(butyl methacrylate) and styrene acrylic polymers.

Styrene polymers are polymers formed from at least one styrene monomer and at least one vinyl monomer, olefin monomer and/or maleic monomer. Examples of styrene monomers, vinyl monomers, olefin monomers and maleic monomers are given above. Examples of styrene polymers are styrene butadiene styrene block polymers, styrene ethylene butadiene block polymers, styrene ethylene propylene styrene block polymers.

Vinyl polymers are polymers formed from at least one vinyl monomer or from at least one vinyl monomer and at least one olefin monomer or maleic monomer. Examples of vinyl monomers, olefin monomers and maleic monomers are given above. Examples of vinyl polymers are polyvinyl chloride and polyvinylalcohol.

Polyolefins are polymers formed from at least one olefin monomer. Examples of olefin monomers are given above. Examples of polyolefines are polyethylene, polypropylene and polybutadiene. Aldehyde polymers are polymers formed from at least one aldehyde monomer or polymer and at least one alcohol monomer or polymer, amine monomer or polymer and/or urea monomer or polymer. Examples of aldehyde monomers are formaldehyde, furfural and butyral. Examples of alcohol monomers are phenol, cresol, resorcinol and xylenol. An example of polyalcohol is polyvinyl alcohol. Examples of amine monomers are aniline and melamine. Examples of urea monomers are urea, thiurea and dicyandiamide. An example of an aldehyde polymer is polyvinyl butyral formed from butyral and polyvinylalcohol.

Epoxide polymers are polymers formed from at least one epoxide monomer and at least one alcohol monomer and/or amine monomer. Examples of epoxide monomers are epichlorhydrine and glycidol. Examples of alcohol monomers are phenol, cresol, resorcinol, xylenol, bisphenol A and glycol. An example of epoxide polymer is phenoxy resin, which is formed from epichlorihydrin and bisphenol A.

Polyamides are polymers formed from at least one monomer having an amide group or an amino as well as a carboxy group or from at least one monomer having two amino groups and at least one monomer having two carboxy groups. An example of a monomer having an amide group is caprolactam. An example of a diamine is 1,6-diaminohexane. Examples of dicarboxylic acids are adipic acid, terephthalic acid, isophthalic acid and 1,4-naphthalene-dicarboxylic acid. Examples of polyamides are poyhexamethylene adipamide and polycaprolactam.

Polyesters polymers formed from at least one monomer having an hydroxy as well as a carboxy group or from at least one monomer having two hydroxy groups and at least one monomer having two carboxy groups or a lactone group. An example of a monomer having a hydroxy as well as a carboxy group is adipic acid. An example of a diol is ethylene glycol. An example of a monomer having a lactone group is carprolactone. Examples of dicarboxylic acids are terephthalic acid, isophthalic acid and 1,4-naphthalenedicarboxylic acid. An example of polyesters is polyethylene terephthalate. So-called alkyd resins are also regarded to belong to polyester polymers. Polyurethane are polymers formed from at least one diisocyanate monomer and at least one polyol monomer and/or polyamine monomer. Examples of diisocyanate monomers are hexamethylene diisocyanate, toluene diisocyanate and diphenyl methane diiscocyanate.

Examples of sulfone-based polymers are polyarylsulfone, polyethersulfone, polyphenyl-sulfone and polysulfone. Polysulfone is a polymer formed from 4,4-dichlorodiphenyl sulfone and bisphenol A.

Natural polymers can be a cellulose, natural rubber or gelatin. Examples of cellulose derivatives are ethyl cellulose, hydroxypropyl cellulose, nitrocellulose, cellulose acetate and cellulose propionate.

The polymeric binders are known in the art and can be produced by known methods. The polymeric binder can be also produced in situ by UV radiation of a composition comprising monomers, capable of radical polymerisation, and a UV sensitive initiator.

Preferred polymeric binders are acrylic polymers, vinyl polymers, aldehyde polymers, epoxide polymers, polyamides, polyesters and natural polymers and derivatives thereof. More preferred polymeric binders acrylic polymers, vinyl polymers, natural polymers and derivatives thereof.

Even more preferred polymeric binders are poly(methyl methacrylate), poly(butyl meth-acrylate), polyvinyl alcohol and cellulose. Particularly preferred binders are styrene-acrylic or styrene-acrylate copolymers.

The solvent can be any suitable solvent. A suitable solvent can be selected from the group consisting of water, organic solvents, mixtures of organic solvents, and mixtures of one or more organic solvent with water. Preferably, the solvent is water, an organic solvent, a mixture of organic solvents or a mixture of one or more organic solvent with water. More preferably, where the solvent comprises an organic solvent or a mixture of organic solvents, the organic solvent or solvents are preferably selected from the group consisting of d-4-alkanols, Ci-4-polyols, Ci-4-alkyl Ci-4-alkanoates, C3-6-ketones, C4-6-ethers, C2-3-nitriles, nitromethane, dimethylsulfoxide, dimethylformamide, dimethylacetamide, [Lambda]/-methyl pyrolidone and sulfolane, whereby Ci-4-alkanols, Ci-4-polyols and Ci-4-alkyl Ci-4-alkanoates may be substituted with Ci-4-alkoxy.

Examples of Ci-4-alkanols are methanol, ethanol, propanol, isopropanol or butanol, iso-butanol, sec-butanol and tert-butanol. Examples of a Ci-4-alkoxyderivatives thereof are 2-ethoxyethanol and 1-methoxy-2-propanol. Examples of Ci-4-polyols are glycol and glycerol. Examples of Ci-4-alkyl Ci-4-alkanoates are ethyl acetate, butyl acetate, ethyl propionate and ethyl butanoate. Examples of Ci-4-alkoxy derivatives thereof are 2-ethoxyethyl acetate and 2-methoxyethyl acetate. Examples of C3-6-ketones are acetone and methyl ethyl ketone. Examples of C4-6-ethers are dimethoxyethane, diisopropylethyl and tetrahydrofurane. An example of a C2-3-nitrile is acetonitrile. The organic solvent can be a liquid hydrocarbon such as a C5 to C18 hydrocarbon, such as pentane, hexane, heptane, octane or cyclic version such as cyclohexane.

Most preferably, the solvent is an organic solvent or a mixture of organic solvents selected from the group consisting of Ci 4-alkanols, Ci-4-alkyl Ci-4-alkanoates and C3-6-ketones. Most preferably, the organic solvent is a C3-6-ketone or a mixture of C3-6-ketones.

The binder is typically present in an amount of 10-60% w/w.

Examples of suitable binders can be found in the Joncryl range supplied by BASF.

Optional Components

Optional additional components of composition of the present invention can be any other compound suitable for improving the performance of the composition. Examples of optional additional components are mid-IR absorbers, other NIR absorbers. UV absorbers, hindered amines, traditional dyes and pigments, stabilizers and antioxidants, whitening agents such as titanium dioxide, zinc compounds such as zinc oxide and zinc salt of carboxylic acids such as zinc stearate, basic salts such as sodium carbonate, retarders, plasticizers, adhesion promoters and rheology modifiers, biocides, surfactants, foam control agents, leuco dye sensitisers and de-sensitisers.

Application of the Ink

The ink of the present invention can be applied to a substrate to form a coating using any suitable coating technique to any suitable substrate known in the printing industry. Suitable printing techniques include gravure, flexographic and flood coating.

Substrate examples include paper, corrugated fiberboard, cardboard, polymer films such as PE, PP, BOPP, cellulose films and PET. The substrate can be a foodstuff or pharmaceutical preparation, metal, metallic foil, ridged plastic article, textile or leather.

The ink of the present invention can be used to create a multilayer construction that comprises more than two layers (the ink layer and the substrate layer). This can include other ink or coating layers, barrier layers to protect the laser sensitive layer from environmental factors such as light, air, pressure and friction, primer layers directly underneath the laser sensitive layer, or other functional layers to form a multilayer construction. Other functional layers include adhesive layers to form labels, backing layers such as glassine backing, upper release layers such as those formed by silicone based release lacquers, upper polymeric film layers particularly transparent polymeric films to form a tape construction. Particularly preferred types of adhesive in these examples are those that form pressure sensitive labels and tapes. For example a pressure sensitive adhesive backing layer in combination with an upper release layer to form a pressure sensitive NIR imagable laser label, or a pressure sensitive adhesive backing layer in combination with an upper transparent polymeric film layer to form a pressure sensitive NIR imagable tape.

Image Formation

After application of the ink of the invention to a suitable substrate, an image can be formed by exposing at least part of the coating to electromagnetic radiation using an energy source, such as a thermal print heat or light source. Preferably, the light source is a laser or laser array system. Most preferably, the electromagnetic radiation is supplied by a $CO_2$, fibre or YAG laser, or a diode or an array of such sources Preferably, the electromagnetic radiation has a wavelength range 200 nm to 20,000 microns. More preferably, the radiation is near infrared radiation having a wavelength in the range 700 nm to 2,500 nm. The radiation can be monochromatic or broadband, coherent or non-coherent. Image formation can also occur using a direct contact thermal print head.

EXAMPLE 1

A powder comprising 12% $CsW_{1.6}O_6$ and 88% $Cs_{0.32}WO_3$ and having an average particle size less than 100 nm was obtained from Shanghai huzheng nanotechnology Co., Ltd under the name GTO-P100.

A Varian-Cary 5000 UV-Vis-NIR spectrophotometer with a wavelength range 200 nm to 2,500 nm was used to determine that average absorption intensity of the powder in the wavelength range 400 nm to 700 nm ($\beta$) and also the maximum absorption intensity value in the range 700 nm to 1200 nm ($\alpha$). The results are shown below.

| | |
|---|---|
| $\beta$ | 0.26 |
| $\alpha$ | 0.50 |
| $\alpha/\beta$ | 1.92 |

The powder was formulated into an ink as follows:

| | | |
|---|---|---|
| Joncryl ECO 675N- MEA | 25.0% | Acrylic resin binder |
| Dispelair CF49 | 1.0% | Mineral oil based foam control agent |
| Pergascript Black 1C | 8.0% | Halochromic leuco dye |
| $CsW_{1.6}O_6/Cs_{0.32}WO_3$ powder | 0.75% | |
| Texicryl S02N-MEA | 24.0% | Acrylic emulsion polymer |
| Water | 23.25% | |
| Tri-n-butylammonium borodisalicylate | 18.0% | Colour developer |

150 ml of ink was prepared by milling in a bead mill for 5 minutes. The ink was then drawn down on to white paper using an RK-Control Coater fitted with a K-bar, to achieve a dry coatweight of 8-10 gsm.

The substrate was then imaged using a 1070 nm, 20W fibre laser controlled by a PC. An image comprising 9×0.25 $cm^2$ squares was created in the fluence range 0 to 5.4 $Jcm^{-2}$. The black optical density was measured for various fluences in that range using a Gregtagmacbeth SpectroEye spectrophotometer.

The colour difference ($\Delta E$) between the coated and uncoated white paper was also determined using a Gregtag-MacBeth SpectroEye 5000 reflectance spectrophotometer (10°, D65).

The $\Delta E$ was measured as 3.53. The black optical density results are displayed below:

| Fluence ($Jcm^{-2}$) | Optical Density |
|---|---|
| 0 | 0.02 |
| 0.6 | 0.43 |
| 1.2 | 0.79 |
| 1.8 | 1.25 |
| 2.4 | 1.69 |
| 3 | 1.86 |
| 3.6 | 1.88 |
| 4.2 | 1.83 |
| 4.8 | 1.41 |
| 5.4 | 1.17 |

The $CsW_{1.6}O_6/Cs_{0.32}WO_3$ powder had excellent laser imaging efficacy at 0.75% and a good background colour.

EXAMPLE 2

Linerless Pressure Sensitive Label

The following ink formulation was prepared:—

| | |
|---|---|
| Joncryl ECO 675 33% ammonia neutralized aqueous solution | 30.0% |
| Texicryl S02 33% ammonia neutralized aqueous solution | 29.75% |
| Water | 13.5% |
| Dispelair CF49 | 1.0% |
| Pergascript Black IR | 5.0% |
| Tri-n-butylammoniumborodisalicylate | 17.5% |
| Zinc stearate | 2.5% |
| $CsW_{1.6}O_6/Cs_{0.32}WO_3$ powder (Y/X = 1.21, 40 nm average particle size) | 0.75% |

The ink was prepared using an Eiger-Torrance bead mill to achieve a dispersion with a particle size less than 5 microns measured using a Hegmann gauge.

The ink was applied to a matt white vellum label paper with a dry coatweight of 8 to 10 gsm. The ink layer was then overcoated with a UV curable silicone release lacquer and UV cured. The back of the paper was coated with a suitable pressure sensitive adhesive. The resulting laser imagable linerless pressure sensitive label was then imaged using a 980 nm fibre laser controlled by a PC. The CIELAB background colour of the laser imagable label was measured using a Gregtagmacbeth SpectroEye (D65, 10°).

| Fluence ($Jcm^{-2}$) | Optical Density |
|---|---|
| 0 | 0.15 |
| 0.6 | 0.56 |
| 1.2 | 0.88 |
| 1.8 | 1.21 |
| 2.4 | 1.30 |
| 3.0 | 1.37 |
| 3.6 | 1.25 |
| 4.2 | 0.95 |
| 4.8 | 0.79 |
| 5.4 | 0.64 |

The label was able to generate an optical density >1 at 3.0 $J/cm^2$, good enough for both human readable text and machine readable codes.

Background Colour
L*=87.53
a*=−1.09
b*=−0.6
ΔE with uncoated matt white vellum label paper=4.42.

The coating appeared as a neutral grey colour and had a colour difference acceptable to consumers (<5).

The invention claimed is:

1. An ink formulation comprising:
   (a) a near infrared absorbing system comprising a compound of the formula $M^1W_{1.6}O_6$, wherein $M^1$ is one or more elements selected from the group consisting of H, He, alkali metals, alkaline earth metals, rare-earth elements, Zr, Cr, Mn, Fe, Ru, Co, Rh, Ir, Ni, Pd, Pt, Cu, Ag, Au, Zn, Cd, Al, Ga, In, Tl, Si, Ge, Sn, Pb, Sb, B, F, P, S, Se, Br, Te, Ti, Nb, V, Mo, Ta, Re, Hf, Os, Bi and I, or ammonium;
   (b) a colour change agent; and
   (c) a binder.

2. The ink formulation according to claim 1, wherein $M^1$ is an alkali metal selected from the group consisting of Li, Na, K, Rb, and Cs.

3. The ink formulation according to claim 1, wherein the near infrared absorbing system further comprises a tungsten bronze of the formula $M^2_xW_yO_z$, wherein $M^2$ is one or more elements selected from the group consisting of H, He, alkali metals, alkaline earth metals, rare-earth elements, Zr, Cr, Mn, Fe, Ru, Co, Rh, Ir, Ni, Pd, Pt, Cu, Ag, Au, Zn, Cd, Al, Ga, In, Tl, Si, Ge, Sn, Pb, Sb, B, F, P, S, Se, Br, Te, Ti, Nb, V, Mo, Ta, Re, Hf, Os, Bi and I, or ammonium; and
   wherein x, y and z satisfy the relationships $0.001 \leq x/y \leq 1$ and $2.2 \leq z/y \leq 3$.

4. The ink formulation according to claim 3, wherein $M^2$ is an alkali metal selected from the group consisting of Li, Na, K, Rb, and Cs.

5. The ink formulation according to claim 3, wherein x, y and z satisfy the relationships $0.2 \leq x/y < 1$ and $z/y=3$.

6. The ink formulation according to claim 3, wherein the tungsten bronze of the formula $M^2_xW_yO_z$ is $Cs_{0.28-0.34}WO_3$.

7. The ink formulation according to claim 3, wherein the compound of the formula $M^1W_{1.6}O_6$ and the tungsten bronze of the formula $M^2_xW_yO_z$ are present at a ratio of $M^1W_{1.6}O_6:M^2_xW_yO_z$ from 1:100 to 5:1.

8. The ink formulation according to claim 1, wherein the near infrared absorbing system is in the form of a powder having an average particle size in the range from 1 nm to 1,000 nm.

9. The ink formulation according to claim 1, wherein the near infrared absorbing system has a ratio of α to β represented by α/β, of less than 2, wherein β denotes an average value of absorption intensities with respect to light having wavelengths in the range of 400 nm to 700 nm, and α denotes a maximum value among absorption intensities with respect to light having wavelengths greater than 700 nm but smaller than or equal to 1,200 nm.

10. The ink formulation according to claim 1 wherein the colour change agent forms colour essentially irreversibly and is selected from the group consisting of metal oxyanion, a diacetylene, a leuco dye, a charge transfer agent, a charrable agent and combination thereof.

11. The ink formulation according to claim 10, wherein the metal oxyanion is a molybdenum compound.

12. The ink formulation according to claim 11, wherein the molybdenum compound is ammonium molybdate or a metal molybdate.

13. The ink formulation according to claim 12, wherein the metal molybdate is sodium molybdate.

14. The ink formulation according claim 13, wherein the ammonium molybdate is ammonium octamolybdate.

15. The ink formulation according to claim 10, wherein the diacetylene is either irreversibly or reversibly activatable.

16. The ink formulation according to claim 10, wherein the leuco dye is photochromic, thermochromic or halochromic.

17. The ink formulation according to claim 16, wherein the leuco dye is utilized in combination with a colour developing agent.

18. The ink formulation according to claim 17, wherein the colour developing agent is a thermal acid generating compound.

19. The ink formulation according to claim 18, where the acid generating compound is a boron- or silicon-based complex ammonium salt compound.

20. The ink formulation according to claim 10, wherein the charrable agent is a compound that comprises at least one hydroxyl group.

21. The ink formulation according to claim 20, wherein the charrable agent is utilized in combination with an acid or base generating agent.

22. The ink formulation according to claim 1, wherein $M^1$ is an alkaline earth metal selected from the group consisting of Be, Mg, Ca, Sr, and Ba.

23. An ink formulation according to claim 3, wherein $M^2$ is an alkaline earth metal selected from the group consisting of Be, Mg, Ca, Sr, and Ba.

24. The ink formulation according to claim 3, wherein the tungsten bronze of the formula $M^2_xW_yO_z$ is $Cs_{0.32}WO_3$.

25. The ink formulation according to claim 3, wherein the compound of the formula $M^1W_{1.6}O_6$ and the tungsten bronze of the formula $M^2_xW_yO_z$ are present at a ratio of $M^1W_{1.6}O_6:M^2_xW_yO_z$ from 1:10 to 1:5.

26. The ink formulation according to claim 1, wherein the near infrared absorbing system is in the form of a powder having an average particle size in the range from 1 nm to 100 nm.

27. The ink formulation according to claim 10, wherein the charrable agent is a carbohydrate.

28. The ink formulation according to claim 21, wherein the base generating agent is a metal salt.

29. A substrate coated with the ink formulation according to claim 1.

30. The substrate according to claim 29, wherein the substrate is cellulose-based, a plastic film, a metal foil, a textile, a ridged plastic article, a foodstuff or a pharmaceutical preparation.

31. The substrate according to claim 29, wherein the cellulose-based substrate is selected from the group consisting of paper, cardboard, corrugated fiberboard and cellulose film, and the plastic film substrate is selected from the group consisting of PE, PP, BOPP, and PET.

32. A method of providing an image on a substrate comprising:
   (a) applying an ink formulation according to claim 1 to the substrate to form a coating; and
   (b) exposing at least part of the coating to electromagnetic radiation so as to form an image.

33. The method according to claim 32, wherein the electromagnetic radiation has a wavelength range from 200 nm to 20,000 microns.

34. The method according to claim 33, wherein the radiation is near infrared radiation having a wavelength in the range from 700 nm to 2,500 nm.

35. The method according to claim 33, wherein the radiation is supplied by a laser, or a diode or an array of such sources.

36. The method according to claim 35, wherein the laser is a $CO_2$, fibre or YAG laser.

* * * * *